(12) United States Patent
Vu et al.

(10) Patent No.: US 7,867,812 B2
(45) Date of Patent: Jan. 11, 2011

(54) METHOD FOR PRODUCTION OF THIN SEMICONDUCTOR SOLAR CELLS AND INTEGRATED CIRCUITS

(76) Inventors: Duy-Phach Vu, 2021 Carignan Way, San Jose, CA (US) 95135; Quoc-Bao Vu, 2118 Chamber Dr., Allen, TX (US) 75013

( * ) Notice: Subject to any disclaimer, the term of this patent is extended or adjusted under 35 U.S.C. 154(b) by 0 days.

(21) Appl. No.: 12/501,039

(22) Filed: Jul. 10, 2009

(65) Prior Publication Data

US 2010/0009492 A1    Jan. 14, 2010

Related U.S. Application Data

(60) Provisional application No. 61/080,041, filed on Jul. 11, 2008.

(51) Int. Cl.
    *H01L 21/00* (2006.01)
(52) U.S. Cl. .............................. 438/89; 438/69; 438/97; 257/E21.133
(58) Field of Classification Search .................. 438/69, 438/89, 97, 486, 795; 257/E21.133
See application file for complete search history.

(56) References Cited

U.S. PATENT DOCUMENTS 6,331,208 B1 * 12/2001 Nishida et al. ................ 117/89
7,285,476 B2 * 10/2007 Shimoda et al. ............. 438/455

OTHER PUBLICATIONS

Slaoui, et al.,"Silicon Films on Ceramic Substrates (SOCS): Growth and Solar Cells," WCPEC, 2003.
Vu, et al.,"Halogen lamp recrystallization of silicon on insulating substrates,", J. Appl. Phys., 1983, pp. 437-439, vol. 54, No. 1, American Institute of Physics.
Yablonovitch, et al., "Extreme selectivity in the lift-off of epitaxial GaAs films," Appl. Phys. Lett., 1987, pp. 2222-2224, vol. 51, No. 26.
Goldstein, "Stacking different chips in a package tucks a complete system into implantable devices like hearing aids. Cell phone and wearable computers could be next," IEEE Spectrum, 2001, pp. 46-51.
Morikawa, et al.,"Development of high-efficiency thin-film Si solar cells using zone-melting recrystallization," Solar energy materials & solar cells, 2001, pp. 261-268, vol. 65.
Colinge, et al.,"Short Course Program: Silicon-on-Insulator," IEDM, 1990.
Salerno, et al.,"5.7: Late-News Paper: Single-Crystal Silicon Transmissive AMLCD," SID, 1992, pp. 63-66.
Fan, et al.,"Lateral epitaxy by seeded solidification for growth of single-crystal Si films on insulators," Appl. Phys. Lett., 1981, pp. 365-367, vol. 38, No. 5.

(Continued)

*Primary Examiner*—Hsien-ming Lee
*Assistant Examiner*—Kevin Parendo
(74) *Attorney, Agent, or Firm*—Browdy and Neimark, P.L.L.C.

(57) ABSTRACT

The invention relates to the formation of thin-film crystalline silicon using a zone-melting recrystallization process in which the substrate is a ceramic material. Integrated circuits and solar cells are fabricated in the recrystallized silicon thin film and lifted off the substrate. Following lift-off, these circuits and devices are self-sustained, lightweight and flexible and the released ceramic substrate can be reused making the device fabrication process cost effective.

20 Claims, 3 Drawing Sheets

OTHER PUBLICATIONS

Schermer, et al.,"High rate epitaxial lift-off of InGaP films from GaAs substrates," Appl. Phys. Lett., 2000, pp. 2131-2133, vol. 76, No. 15.

Kazmerski,"Solar photovoltaics R&D at the tipping point: A 2005 technology overview," Journal of electron spectroscopy and related phenomena, 2006, pp. 105-135, vol. 150, Elsevier B.V.

Haond, et al.,"Single crystal soi films obtained on 4. in wafers using halogen lamps," MRS, 1986, pp. 83-88.

Spitzer, et al.,"Application of circuit transfer technology to displays and optoelectronic devices," SPIE, 1996.

Zavracky, et al.,"Silicon-on-insulator wafers by zone melting recrystallization," Solid state technology, 1991, pp. 55-57.

Brendel,"Crystalline thin-film silicon solar cells from layer-transfer processes: a review," 10th Workshop, 2000, pp. 117-125.

Dekker, et al.,"Substrate Transfer: Enabling Technology for RF Applications," IEEE, 2003, pp. 371-374.

McClelland, et al.,"A technique for producing epitaxial films on reuseable substrates," Appl. Phys. Lett., 1980, pp. 560-562, vol. 37, No. 6.

Tatavarti, et al.,"Lightweight, Low Cost GaAs Solar Cells on 4" Epitaxial Liftoff (ELO) Wafers, PVSC, 2008.

Bau, et al.,"Chemical vapour deposition of silicon on ceramic substrates for crystalline silicon thin-film solar cells," 17th European photovoltaic solar energy conference, 2001, pp. 1-4, Munich, Germany.

Janz, et al.,"Optical confinement in recrystallised wafer equivalent thin film solar cells," European photovoltaic solar energy conference and exhibition, 2007, Milan.

Reber, et al.,"Progress in crystalline silicon thin-film solar cell work at fraunhofer ise," European photovoltaic solar energy conference and exhibition, 2006, Barcelona.

Kieliba, et al.,"Coarse-grained si films for crystalline si thin-film solar cells prepared by zone-melting recrystallization," 17th EU-PVSEC, 2001, Munich.

Nishimura, et al.,"Three Dimensional IC for High Performance Image Signal Processor," IEDM, 1987, pp. 111-114.

* cited by examiner

METHOD FOR PRODUCTION OF THIN SEMICONDUCTOR SOLAR CELLS AND INTEGRATED CIRCUITS

PRIORITY STATEMENT

The present application claims benefit from the U.S. provisional application No. 61/080,041 filed on Jul. 11, 2008, the disclosure of which is incorporated herein in its entirety by reference.

BACKGROUND OF THE INVENTION

1. Field

A solar cell is a device that converts sunlight into electricity by the photovoltaic effect. The solar cell consists of a p-n junction fabricated in a single-crystal semiconductor material, such as silicon, germanium or gallium-arsenide.

2. Description of the Related Art

Currently, silicon cells account for over 90% of the solar cell fabricated in the world (see L. L. Kazmerski, "Solar photovoltaics R&D at the tipping point: A 2005 technology overview", *J. of Electron Spectroscopy and Related Phenomena*, 150 (2006), 105-135).

Silicon solar cells can be divided into three groups, depending on the quality of the material: (1) monocrystalline silicon solar cells, which can have efficiencies approaching the theoretical limit of 29%; (2) polycrystalline silicon cells, which can reach a 20% efficiency; and (3) amorphous silicon cells, which give a 12% efficiency. Although monocrystalline silicon solar cells have the highest efficiency, the high efficiency comes with the high cost of the monocrystalline silicon wafers. It has been calculated that the cost of the silicon wafer accounts for more than 50% of the total cost of producing the solar cell (Id.).

Actually, the p-n junction forming the solar cell device uses only a thin layer, i.e., 5-50 microns of silicon on the front side of the silicon wafer. The remainder silicon thickness of the wafer (a 6-in silicon wafer has a thickness of 650 microns) serves merely as a mechanical substrate. The most cost-effective solar cell would be a cell made in a thin layer of single-crystal silicon on a low-cost mechanical substrate.

Several techniques have been devised to produce thin-film crystalline silicon (see *Short Course on SOI, IEDM* 1990, San Francisco). Zone-melting recrystallization (ZMR) is one of these methods. ZMR has been intensively used in the early 1980's around the world as a method to fabricate silicon-on-insulator (SOI) (J. C. C. Fan et al., "Lateral epitaxy by seeded solidification for growth of crystal Si films on insulators", *Appl. Phys. Lett.* 38, 365 1981; D. P. Vu et al., "Halogen lamp recrystallization of silicon on insulator substrates, *J. Appl. Phys.*, 54, 437, 1983). SOI is a preferred material to bulk Si for integrated circuits due to its properties such as faster switching speed, suppression of latch-up for CMOS circuits and radiation resistant components (see P. M. Zavracky et al., "Silicon-on-insulator wafers by zone melting recrystallization", *Solid State Technology*, April 1991, p. 55). In the ZMR process, small grain silicon (polycrystalline Si or amorphous Si, in short polySi or aSi, respectively) is melted and regrown into large grains or near single-crystal Si. Briefly, as shown in FIG. 1, in a ZMR process for making SOI, a polySi layer 12 is deposited on a silicon dioxide 13 coated silicon wafer 14. An oxide layer 11 is subsequently deposited on top of the polySi layer 12 and serves as a cap layer.

Referring to FIG. 2, the recrystallization of polySi by a ZMR technique for SOI uses a base heater 21 to raise the temperature of the sample to 1000-1200° C. A second heater, top heater 22, brings the additional energy to melt a thin band of polySi (Si melts at 1415° C.). The molten silicon band is scanned across the wafer by either moving the wafer relative to the top heater or by moving the top heater relative to the wafer. In the wake of the molten zone, silicon recrystallizes producing large Si grains.

Referring back to FIG. 1, an opening 15 in the oxide 13 at the beginning of the scan allows the polySi 12 to contact the single-crystal Si substrate 14, which serves as a single-crystal Si seed. The recrystallization is a liquid phase vertical epitaxy starting from the seed. As the molten zone moves from the opening over the oxide, the vertical epitaxy turns into a lateral epitaxy, as shown by the arrow in FIG. 1. The result is the conversion of a polySi layer to a near single-crystal Si layer.

Two main methods were developed to perform ZMR of silicon. They are characterized by the dwell time, i.e., the time the silicon remains in the liquid phase. With a laser as the top heater, due to the high concentration of energy in the laser beam, the dwell time can be in a nanosecond (pulsed laser) or millisecond range (CW laser). With a graphite strip or with a halogen lamp, this time is in a second range. The two methods serve two different applications. With a laser, the very short dwell time allows to locally melt silicon without damaging any device placed nearby or underneath. This method has led to the fabrication of three-dimensional structures (see T. Nishimura et al., "Three dimensional IC for high performance image signal processor", *IEDM* 1987, p. 111). With the graphite strip or the halogen lamp, the long dwell time can only produce material in which devices/circuits can be processed afterward.

FIG. 2 shows a ZMR system using halogen lamps (see M. Haond et al., "<100> Single crystal SOI films obtained on 4-in wafers using halogen lamps," *MRS Fall Meeting Symp. Proc.*, vol 53, p. 83, 1986). The system consists of a bank of linear halogen lamps 21 to preheat the wafer 24 uniformly to 1000-1200° C. A focused beam from another halogen lamp 22 scans across the wafer 24 to bring the additional energy to melt a narrow band 23 of the poly-Si layer on the wafer 24. In a graphite heater system, the base heater is a graphite sheet and the top heater is a graphite wire (see description in U.S. Pat. Nos. 4,885,052, 5,021,119, and 5,453,153).

Using a graphite heater or a halogen lamp system, under optimum conditions, single-crystal Si was obtained with a small amount of minor defects like threading dislocations and subgrain boundaries (see U.S. Pat. No. 5,453,153).

In recent years, ZMR has been used to produce thin-film silicon for solar cells. To reduce cost, research was done on a thin microcrystalline silicon layer deposited on a foreign substrate-ceramics (the silicon wafer 14 shown in the SOI structure of FIG. 1 is replaced by a low-cost ceramic substrate). But without the presence of a single-crystal silicon seed only enlarged silicon grains are obtained (see S. Reber et al., "Progress in crystalline silicon thin-film solar cell work at Fraunhofer ISE," *European Photovoltaic Solar Energy Conference and Exhibition*, June 2005, Barcelona).

Another method to produce thin-film material for solar cells (and in general integrated circuits (ICs)) is the Circuit Transfer in which circuits processed in standard IC processing lines are transferred to alternative substrates. The advantage of this technique is the freedom in the choice of the final substrate and the possibility of reusing of the original substrate (see M. B. Spitzer et al., "Application of circuit transfer to displays and optoelectronic devices," *Optoelectronic Packaging Conf, SPIE Photonics West* 1996 *Symposium*, also see U.S. Pat. No. 5,256,562).

The circuit transfer for a gallium-arsenide (GaAs) solar cell fabrication was first used by McClelland to reduce the fabrication cost of GaAs substrate (McClelland et al., "A technique for producing epitaxial films on reusable substrates", *Appl. Phys. Lett.* 37, 560, Sep. 15, 1980). ICs processed in the silicon thin-film of an SOI wafer have been transferred to glass for flat-panel microdisplays (J. P. Salerno et al., "Single-crystal silicon transmissive AMLCD", *SID*, Boston, Mass. 1992).

SUMMARY

The present invention describes a method that combines two processes, zone-melting recrystallization (ZMR) and circuit transfer, to fabricate a thin crystalline silicon layer in which very low-cost and highly efficient silicon solar cells and/or integrated circuits can be produced.

The thin-film crystalline silicon is obtained by ZMR of polycrystalline silicon deposited on a silicon dioxide coated ceramic substrate. The ceramic substrate is used as a temporary support (i.e., a substrate) for the recrystallization process and for the device fabrication process.

Solar cells are fabricated using the standard integrated circuit (IC) process steps in which the 'wafer' is the silicon on ceramic material.

After the process steps, the solar cells are lifted off the substrate by dissolving in hydrofluoric acid the silicon dioxide layer between the recrystallized silicon layer and the substrate.

The solar cells fabricated in the recrystallized silicon can achieve the high efficiency and reliability of crystalline silicon while using one-hundredth of the amount of silicon used if the same cells were made in a bulk silicon wafer.

The silicon on ceramic 'wafer' can be processed for large-scale ICs and these circuits can be lifted off the substrate after the device fabrication.

The ceramic substrate released by the lift-off is unaffected by the ZMR process and the device fabrication process and can be re-used repeatedly. This re-usability results from the high mechanical strength and very high temperature capability of ceramics.

BRIEF DESCRIPTION OF THE DRAWINGS

The drawings are not in scale; emphasis instead is placed thereupon to illustrate the principles of the invention.

DETAILED DESCRIPTION OF THE INVENTION

Figure 1:
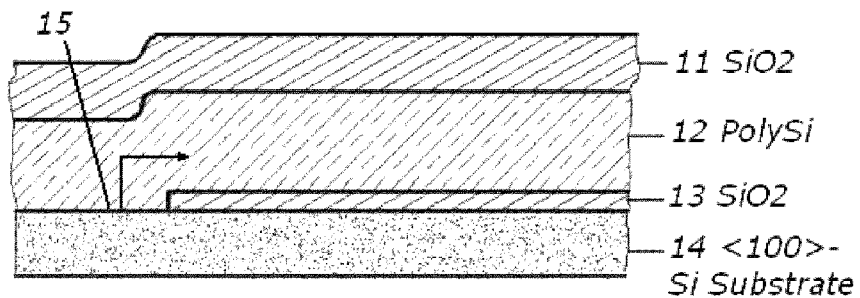
FIG. 1 is a cross-sectional view of a SOI structure with an opening in the buried oxide to contact the polySi layer to the single-crystal silicon substrate.
Figure 2:
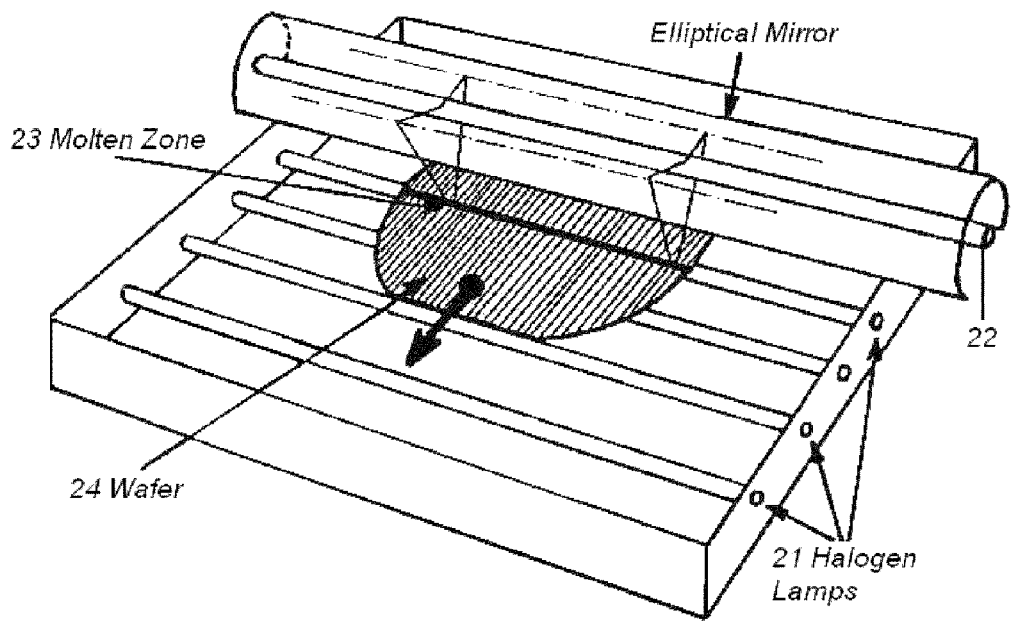
FIG. 2 is a perspective view of a halogen lamp zone melting recrystallization apparatus.

Embodiments of the present invention will now be described more fully with reference to the accompanying drawings, in which the embodiments are shown. The present invention may, however, be embodied in many different forms and should not be construed as being limited to the embodiments set forth herein; rather, the embodiments are provided so that this disclosure will be thorough and complete, and will fully convey the concept of the invention to one skilled in the art. In the drawings, the dimensions and regions are exaggerated for clarity. Like reference numerals in the drawings denote like elements, and thus, their description will not be repeated.

Accordingly, while embodiments of the invention are capable of various modifications and alternative forms, only the embodiments thereof are shown by way of example in the drawings and will herein be described in detail. It should be understood, however, that there is no intent to limit embodiments of the invention to the particular forms disclosed, but on the contrary, embodiments of the invention are to cover all modifications, equivalents, and alternatives falling within the scope of the invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "on" versus "directly on", "between" versus "directly between", "adjacent" versus "directly adjacent", etc.).

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the Figs. For example, two Figs. shown in succession may in fact be executed substantially concurrently or may sometimes be executed in the reverse order, depending upon the functionality/acts involved.

Although the embodiments of the present invention have been disclosed for illustrative purposes, those skilled in the art will appreciate that various modifications, additions and substitutions are possible, without departing from the scope and spirit of the invention as disclosed in the accompanying claims.

Figure 3:
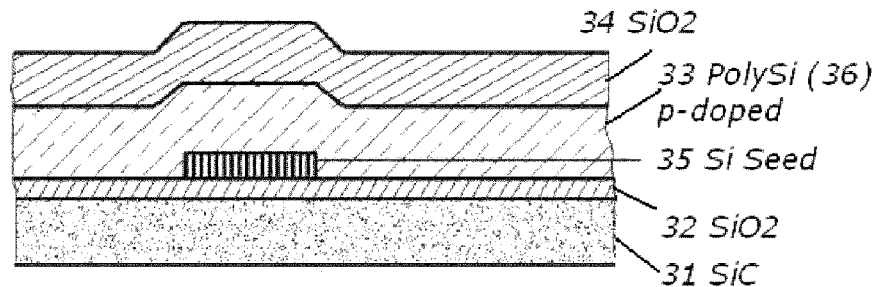
FIG. 3 is a cross-sectional view of a Si on SiC structure with a single-crystal silicon strip used as a seed for a recrystallization of a polySi layer.

A preferred embodiment of the invention for fabricating thin crystalline silicon films for solar cell applications is illustrated in FIG. 3. The ceramic substrate 31 is a square silicon carbide (SiC) wafer, which is typically 500 microns in thickness for a 100 cm×100 cm wafer. A layer of silicon dioxide ($SiO_2$) 32, which is 2-3 microns in thickness, is deposited on the SiC substrate. A thin strip of single-crystal silicon 35, having a <001>-surface crystal orientation and a [100]-direction along a long side thereof, is placed on the $SiO_2$ layer 32 at a front surface of the SiC substrate 31. The long side of the strip of single-crystal silicon 35 parallels an edge of the SiC substrate 31. A polySi layer 33 (5 to 10 micron-thick) is subsequently deposited on the SiO$_2$ layer 32 by Chemical Vapor Deposition method (CVD) covering both the single-crystal silicon strip 35 and the SiO$_2$ layer 32. The polySi layer 33 can be in-situ doped, preferably in p-type in a $10^{17}$/cm$^3$ range, saving a later process step in the solar cell fabrication. Finally, a 2-3 micron-thick SiO$_2$ capping layer 34 is deposited on the polySi layer 33.

SiC is chosen because of its very high hardness, superior thermal properties compared to other ceramics and its coefficient of thermal expansion is close to that of Si. For solar cell applications, square substrates are more desirable than circular ones commonly used in the mainstream IC production.

The single-crystal silicon strip 35 plays a major role in the ZMR process. It is the necessary seed for the conversion of the micro-crystals into single-crystal silicon. This strip can be prepared from a commercial SOI wafer, which is a <100>-silicon substrate, having a 0.25-0.5-micron buried oxide and a 0.5-1-micron <100> crystal orientation silicon film respectively deposited thereon. The SOI wafer is first diced into a strip with a width of 2-5 mm and with its long side being parallel to the [100]-direction. This strip is then bonded to the oxide-covered SiC substrate, with the 0.5-1 microns <100> crystal orientation silicon film facing towards the SiC substrate. The silicon substrate of the SOI strip is then etched off by an anisotropic etch, such as tetramethyl-ammonium hydroxide (TMAH). Note that TMAH does not etch SiO$_2$ or SiC, consequently no etch mask is needed. Finally, a fast HF etch is used to remove the buried oxide to expose the Si seed.

The Si on SiC structure of FIG. 3 is submitted to the ZMR process as described above. Upon recrystallization, the single-crystal silicon strip 35 serves as a seed, and the polySi layer 33 is transformed into a single-crystal silicon layer 36 with the same crystalline orientation as that of the seed 35. After ZMR, the recrystallized Si thin film 36 can be thickened by epitaxy if required by the design of the solar cell.

In the fabrication of SOI by ZMR, under optimum conditions, the recrystallized silicon film is observed to be nearly single-crystal with mainly sub-boundaries and threading dislocations as crystalline defects. Also, the SOI by ZMR wafer shows 'slips' lines due to the slip planes in the silicon substrate generated by the thermal stress encountered during ZMR. They result in thickness variations in the recrystallized film and a warped wafer. The crystalline defects are detrimental to device operation and the thickness variation and wafer warp affect processing. The exact cause of the defects is not known. They may be attributable to thermal instability coupled with the sharp thermal gradients and the presence of oxygen in the wafer (U.S. Pat. No. 5,453,153).

The substitution of the Si substrate by the SiC substrate improves the quality of the recrystallized silicon. With SiC, the defects observed on SOI by ZMR wafers are minimized, if not totally eliminated. This result comes from the better thermal/mechanical properties of SiC compared to Si. Indeed in the ZMR process while the Si substrate is brought practically to the melting point of Si, the SiC substrate is still within its operating temperature range and far below its melting point, 2730° C. Also, due to the high thermal conductivity of SiC, temperature uniformity in the polySi layer is better with SiC than with Si.

Figure 4A:
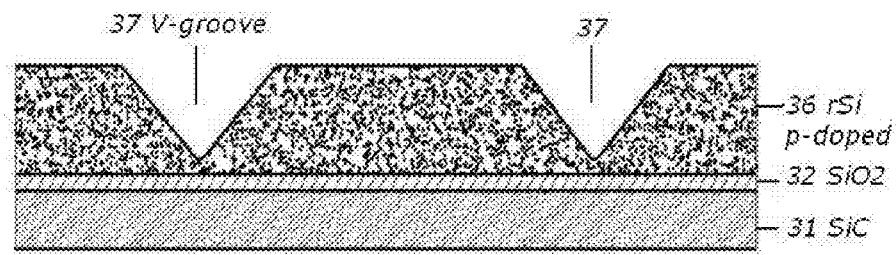
FIGS. 4A-4D shows the main steps in the fabrication of solar cells of this invention.
Figure 4B:
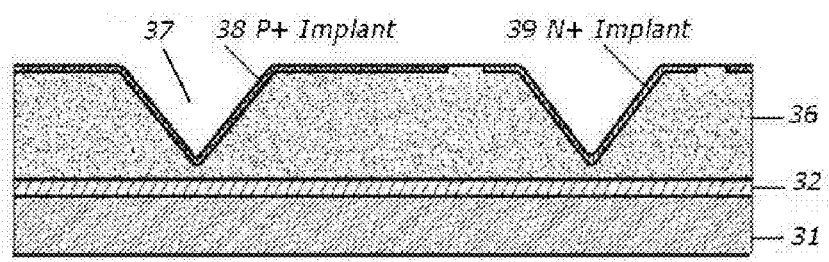

The recrystallized silicon (rSi) thin film on its substrate is then processed for solar cells. Note that the rSi layer 36 is p-doped prior to ZMR as mentioned earlier. FIGS. 4A-4D shows the main steps in the process of forming a solar cell. As shown in FIG. 4A, V-grooves 37 are formed on the rSi layer 36 by an anisotropic etch. Subsequently, a heavily P+-doped region 38 and a heavily N+-doped region 39 through implantation or diffusion are formed in adjacent grooves, respectively. These regions serve as base and emitter contacts, respectively, for the solar cell as shown in FIG. 4B. The V-shaped grooves also serve later in the solar cells as reflectors for sunlight increasing light collection efficiency.

Figure 4C:
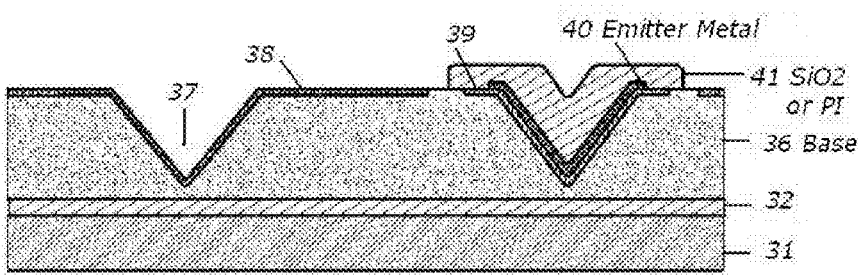
Figure 4D:
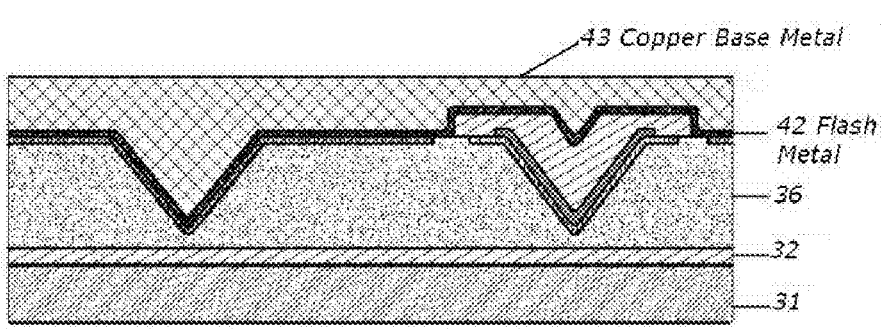

FIGS. 4C-4D illustrate the metallization of the contacts. The emitter metal 40 is deposited over region 39. It is then covered with an insulator 41 (SiO2 or polyimide). The base metal 42 is deposited over region 38 and covering the insulator 41. This base metal is thickened by a metal backing layer 43 obtained by depositing 15-25 microns of copper or copper-nickel through electrolysis to provide the mechanical support for the solar cell.

Figure 5A:
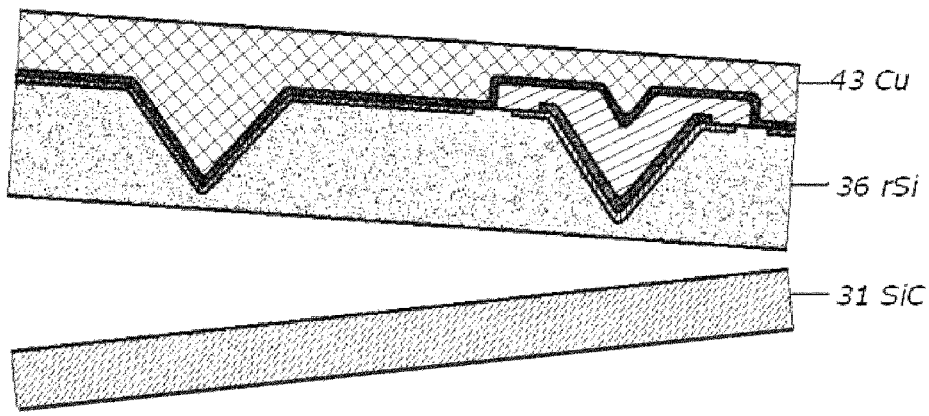
FIGS. 5A-5B shows a final solar cell structure after a Lift-off process.

Once the abovementioned processes performed on the rSi layer 36 are complete, a lift-off process of the solar cells is conducted by dissolving in a diluted hydrofluoric acid the SiO2 layer 32 (i.e., sacrificial layer) between the rSi layer 36 and the SiC substrate 31. FIG. 5A shows the result of the lift-off. Note that the solar cells after the lift-off process are self-sustained and mechanically strong, i.e., they do not need additional supplemental substrate.

Figure 5B:
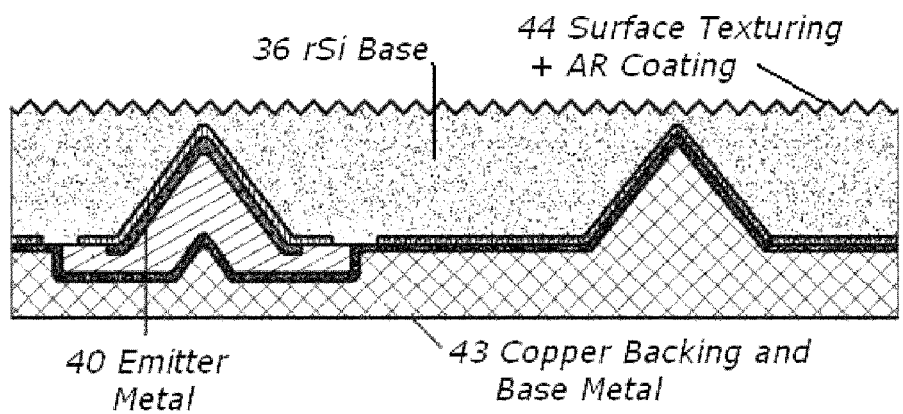

Referring to FIG. 5B, to complete the processing, the exposed 'front-side' of the solar cells receives a pyramidal texture and an antireflection coating 44 to maximize light confinement in the device. The 'front-side' of the solar cell is defined as the Si surface facing the SiO$_2$ layer 32 before the lift-off process.

The solar cells that are released from the SiC substrate 31 are light-weight and flexible thin-film devices. They can accommodate various packaging schemes. The SiC substrate 31, released by the lift-off process, can be reused again.

In one embodiment, the recrystallized Si layer on SiC substrate can be used like an ordinary SOI wafer for IC fabrication. Lift-off of the processed wafer creates a new type of thin-film ICs that possess, besides being light-weight and flexible, high heat dissipation capability due to the copper backing layer. These circuits can be arranged in configurations such as three-dimensional structures or folded system-in-stacks without the serious problem of heat dissipation (see H. Goldstein, "Packages", *IEEE Spectrum*, P. 46, August 2001).

While the present invention has been particularly shown and described with reference to the above-described embodiments, it should be understood that those skilled in the art would be capable of devising various changes in form and detail without departing from the spirit and scope of the invention. For example, although a SiC substrate has been used in reference to the preferred embodiments other ceramics are also contemplated within the scope of the invention. Furthermore, the polySi material may be replaced by other materials, such as a combination of germanium and silicon to form a silicon-germanium compound ($Si_{1-x}Ge_x$) or carbon and silicon to form a silicon-carbon compound ($Si_{1-x}C_x$) obtained by co-deposition or by depositing a multi-layer made of polySi and polyGe, in the mole fraction ratio 1–x to x. Also, the single-crystal seed and the polycrystalline material can be germanium.

What is claimed is:

1. A method for fabricating a thin film crystalline silicon solar cell, the method comprising:
   providing a substrate;
   forming a first insulating layer on the substrate, wherein the first insulating layer is a sacrificial layer;
   forming a crystal seed on the first insulating layer, wherein the crystal seed is a single-crystal material layer partially covering the first insulating layer;

forming a polycrystalline material layer on the first insulating layer and the single-crystal material layer;

forming a second insulating layer on the polycrystalline material layer;

forming an active layer by recrystallizing the polycrystalline material layer to a single-crystal material with a same crystal orientation as that of the crystal seed;

forming a solar cell on the active layer;

forming a backing layer on the solar cell; and removing the sacrificial layer to separate the solar cell from the substrate.

2. The method of claim 1, wherein the substrate is formed of a ceramic material and the substrate had been previously used in the fabrication of another thin film solar cell.

3. The method of claim 1, wherein the substrate is formed of silicon carbide material and the substrate had been previously used in the fabrication of another thin film solar cell.

4. The method of claim 1, wherein the sacrificial layer is silicon dioxide.

5. The method of claim 1, wherein the single-crystal material layer and polycrystalline material layer are both silicon or both germanium.

6. The method of claim 1, wherein the single-crystal material layer is silicon and polycrystalline material is a silicon-germanium compound ($Si_{1-x}Ge_x$) obtained by codeposition or by depositing a multi-layer made of polySi and polyGe in a mole fraction ratio of 1−x to x.

7. The method of claim 1, wherein the single crystal material is silicon and polycrystalline material layer is silicon-carbon compound ($Si_{1-y}$-$C_y$) obtained by codeposition or by depositing a multi-layer made of polySi and polycrystalline carbon in a mole fraction ratio of 1−y to y.

8. The method of claim 1, wherein forming the single-crystal material layer comprising:

dicing a SOI wafer with a <100>-single-crystal silicon thin film deposited on a <100>-single-crystal silicon wafer to form a strip dice, and the strip dice has a side parallel to the [001] orientation;

bonding the strip dice to the substrate, so as to have the single-crystal silicon thin-film facing and bonding to the first insulating layer on the substrate;

anisotropically etching off the single-crystal silicon wafer of the strip dice;

etching off a buried oxide layer of the strip dice.

9. The method of claim 1, wherein the recrystallized single-crystal material layer has one of a p-doped and n-doped type of conductivities.

10. The method of claim 9, wherein forming the solar cell in the active layer comprising:

anisotropically forming a plurality of V-shape grooves on the active layer;

defining a first region in the active layer, wherein the first region covers a first V-groove and a portion of a surface of the active layer;

doping the first region with a same type of conductivity of the active layer ;

defining a second region in the active layer, wherein the second region covers a second V-groove such that the second region is indirectly adjacent to the first region;

doping the second region with an opposite type of conductivity of that of the first region;

forming a first metal contact to the second region;

forming an insulator over the second region;

forming a second metal contact to the fist region and covering the second region isolated by the insulator; and forming a metal backing layer contacting the first metal contact to the first region.

11. The method of claim 10, wherein the first region is p-type doped and the second region is n-type doped.

12. The method of claim 10, wherein forming the backing layer is by depositing a metal or metals using electrolysis.

13. The method of claim 10, wherein forming the backing layer is by depositing copper or copper-nickel using electrolysis.

14. The method of claim 10, wherein removing the sacrificial layer comprises:

immersing the substrate, sacrificial layer, active layer, and backing layer in an etching solution to dissolve the sacrificial layer.

15. The method of claim 1 further comprising:

applying a surface texturing to the active layer; and applying an antireflection coating to the active layer.

16. The method of claim 1, wherein the thin film crystalline silicon solar cell is flexible.

17. The method of claim 1, further comprising:

forming an integrated circuit on the recrystallized single-crystal material layer.

18. The method of claim 17, wherein the integrated circuit is flexible.

19. The method of claim 17, wherein the integrated circuit has a metal backing layer and the metal backing layer is a common ground plane of the integrated circuit.

20. The method of claim 17, wherein the integrated circuit has a copper backing layer.

* * * * *